United States Patent [19]

Menigaux et al.

[11] Patent Number: 4,925,811
[45] Date of Patent: May 15, 1990

[54] METHOD OF MANUFACTURING A SEMICONDUCTOR STRUCTURE SUITABLE FOR PRODUCING A MULTI-WAVELENGTH LASER EFFECT

[75] Inventors: Louis Menigaux, Bures Sur Yvette; Louis Dugrand, Chelles, both of France

[73] Assignee: L'Etat Francais represente par le Ministre Des Postes Et Telecommunications - Centre National d'Etudes des Telecommunications, Issy-Les-Moulineaux, France

[21] Appl. No.: 224,879
[22] PCT Filed: Oct. 23, 1987
[86] PCT No.: PCT/FR87/00414
    § 371 Date: Jun. 30, 1988
    § 102(e) Date: Jun. 30, 1988

[30] Foreign Application Priority Data

Oct. 23, 1986 [FR] France ................... 86 14740

[51] Int. Cl.⁵ .................... H01L 21/20; H01L 21/205
[52] U.S. Cl. ........................ 437/129; 148/DIG. 95; 156/662; 372/48; 372/50; 437/133; 437/987; 437/905
[58] Field of Search ............ 148/DIG. 39, 56, 64, 148/65, 72, 84, 95, 131, 169, 33.4, 33.5; 156/643, 648, 649, 652, 656, 662; 372/48, 50, 97; 437/81, 51, 34, 974, 987, 905, 129, 126, 133

[56] References Cited

U.S. PATENT DOCUMENTS

| | | | |
|---|---|---|---|
| 4,199,385 | 4/1980 | Hung et al. | 357/17 |
| 4,374,390 | 2/1983 | Lee | 357/17 |
| 4,426,704 | 1/1984 | Nagai et al. | 372/50 |
| 4,476,563 | 10/1984 | Van Ruyven | 372/50 |
| 4,547,956 | 10/1985 | Bouadma et al. | 437/129 |
| 4,605,942 | 8/1986 | Camlibel | 357/17 |
| 4,720,468 | 1/1988 | Menigaux et al. | 437/129 |
| 4,747,110 | 5/1988 | Takahashi et al. | 372/50 |

FOREIGN PATENT DOCUMENTS

| | | |
|---|---|---|
| 0001375 | 4/1979 | European Pat. Off. |
| 0091859 | 10/1983 | European Pat. Off. |
| 0199583 | 11/1983 | Japan ................... 372/50 |
| 0185993 | 8/1986 | Japan ................... 372/50 |
| WO82/00921 | 3/1982 | World Int. Prop. O. |
| WO86/02491 | 4/1986 | World Int. Prop. O. |

OTHER PUBLICATIONS

Electronics Letters, vol. 18, No. 1, 7 Jan. 1982, pp. 18–20, "Dual Wavelength InGaAsP/InP TJS Lasers", S. Sakai et al.
Electronics Letters, vol. 18, No. 1, 7 Jan. 1982, pp. 17–18, "InGaAsP/InP Dual Wavelength Lasers", S. Sakai et al.
Patent Abstracts of Japan, vol. 5, No. 167, JP 5696881.
Patent Abstracts of Japan, vol. 5, No. 23, JP 55148477.
Patent Abstracts of Japan, vol. 9, No. 204, JP 6066889.

Primary Examiner—Brian E. Hearn
Assistant Examiner—William Bunch
Attorney, Agent, or Firm—Dennison, Meserole, Pollack & Scheiner

[57] ABSTRACT

A double heterostructure stack comprising confinement layers (CC) enclosing active layers (CA) is formed on a substrate (S), e.g. a N+ type gallium arsenide substrate. Selective etching is performed so as to lay bare the confinement layers at different depths, e.g. CC4, CC3, CC2. The confinement layers initially receive contact layers (CP) made of P-type gallium arsenide. Regions R1, R2, and R3 are formed through the contact layers to constitute junctions with the uppermost active layers (respectively CA1, CA2, CA3). Valleys (V10, V21, V32) are formed to isolate the above-defined elementary stacks. After a metal contact layer has been formed, and after the end surfaces have been optically prepared, a multi-wavelength laser device is obtained.

21 Claims, 2 Drawing Sheets

METHOD OF MANUFACTURING A SEMICONDUCTOR STRUCTURE SUITABLE FOR PRODUCING A MULTI-WAVELENGTH LASER EFFECT

The invention relates to semiconductors, and more particularly to semiconductors which are suitable for optical applications.

It is known that when a P-N junction is electrically excited by a control voltage corresponding to an energy which is greater than its forbidden energy band, it will respond by radiating. The term "semiconductors having light-radiating properties" is used herein to designate those semiconductors in which the radiation is essentially optical in nature, rather than being acoustic.

Such semiconductor are presently obtained using so-called "III-V alloy" materials, i.e. including at least one element from column III of Mendeleev's periodic table and at least one element from column V. More precisely, the elements come from columns IIIA and VA of the current version of said table. Even more precisely, the elements considered are firstly aluminum, gallium, and indium, and secondly phosphorous, arsenic, and antimony.

In known manner, these materials may have or may be given N type conducitivity or P type conducitivity by receiving small quantities of suitable impurities. The initial conductivity of III-V alloys is due to their intrinsic semiconductor properties, and also to residual impurities due to the method by which they are manufactured. For acquired type conducitivity, mention may be made, for example, of zinc, cadmium, magnesium, and beryllium, all of which are suitable for conferring P-type conductivity to gallium arsenide whose initial conductivity is N-type. More generally, since the impurities that should be selected in each case are known, or can be determined, they are not specified each time.

Finally, the person skilled in the art knows that semiconductor structures are generally monocrystalline, unless otherwise specified.

III-V alloys are used, inter alia, for making semiconductor lasers or laser diodes, and these have gained considerable importance since the discovery of the double heterostructure laser diode. Laser diodes are used, in particular, in optical fiber telecommunications, and also for optical disk readers. The term "laser" is used below to designate these semiconductor lasers.

In order to increase the transmission capacity of such systems, wavelength multiplexing can advantageously be used, thus providing a requirement for a "multi-wavelength" laser. However, although "single-wavelength" lasers are the subject of numerous studies, there are very many fewer studies concerning multi-wavelength lasers.

Early proposals were to constitute a double heterostructure stack having different active layers:

W.T. Tsang, "New Multi-wavelength Transverse-Junction Strip Lasers Grown by Molecular Beam Epitaxy Operating Predominantly in Single-longitudinal Modes", Appl. Phys. Lett. 36 (6), 15 Mar. 1980, pp. 441-443;

S. Sakai, T Aoki, M. Tobe, M. Umeno and Y. Amemiya, "Integrated Light Emitters and Photodetectors for Dual-channel Optical Communication", ECOC, Sixth European Conference on Optical Communication, Conference Publication 190, pp. 230, 233;

T. P. Lee, C. A. Burrus, A. G. Dentai, "Dual Wavelength Surface Emitting InGaAsP L.E.D.S.", Electronic Letters, 23 Oct. 1980, Vol. 16, No. 22.

These proposals suffer from the major drawback that all of their wavelengths are excited simultaneously.

Frequency multiplexing is also made possible by laser diodes which include a wavelength-selecting optical grating, also referred to as distributed feedback laser diodes, and described in the following article:

K. Aiki, M. Nakamura and J. Umeda, "Frequency Multiplexing Light Source with Monolithically Integrated Distributed Feedback Diode Lasers", Applied Physics Letters, Vol. 29, No. 8, 15 Oct. 1976.

However, the high technology required for making an integrated grating compromises the use of this method industrially on a large scale.

It has also been suggested that lasers should be made having an active layer with a composition gradient:

ZH. I. Alfrerov, E. N. Arutyunow, S. A. Gurevitch, E. L. Portnoy, N. V. Pronina and V. B. Smirnitsky, "Wavelength Multiplexing DM AlGaAs Injection Laser Source with a Graded Composition along with the Active Layer", IEEE Journal of Quantum Electronics, Vol. QE-17, No. 8, Aug. 1981.

As above, the manufacturing technology is extremely difficult.

Finally, proposals have also been made for lasers obtained with active layers having different compositions and situated in the same plane:

N. Bouadma, J. C. Bouley, J. Riou, "Dual Wavelength (GaAl) As Laser", Electronics Letters, 30 Sept. 1982, Vol. 18, No. 20, pp. 871-873.

In this case the necessary manufacturing means are in themselves fairly well mastered. However, for each of the additional desired wavelengths, it is necessary to perform an etching operation followed by re-starting epitaxy. After two or three sequences of etching followed by re-starting epitaxy, it turns out that the defects in the crystal structure created at each of these operations are cumulative, which gives rise to insurmountable difficulties.

The present invention provides a more satisfactory solution.

One of the objects of the invention is to make it possible to make a laser which each wavelength can be excited independently, or simultaneously with another wavelength.

Another object of the invention is to use multilayer epitaxy once only (i.e. the double heterostructure is made on one occasion only) regardless of the number of wavelengths desired.

The present invention provides a method of manufacturing a semiconductor structure, in particular a structure suitable for producing the laser effect, which method is remarkable in that it comprises the following steps:

(a) a monocrystaline double heterostructure stack is deposited on a substrate, said stack being constituted by active layers of different compositions having light-radiating properties and each sandwiched between two confinement layers having a monocrystaline lattice size close to that of the active layers, with all of these layers having the same type of conductivity (N-type);

(b) the top of the stack is etched selectively in parallel strips which are adjacent to one another in order to lay bare confinement layers at different depths at least over two adjacent strips, with the confinement layers thus laid bare defining parallel terraces which are separated from one another by transitions;

(c) during a second epitaxy stage, a so-called contact semiconductor layer is deposited on said terraces in order to facilitate making an ohmic contact with the structure.

It is also possible to stop the etching in stage (b) level with the top of each of the active zones; which active zones contain not more than 10% Al (as described below) and are capable of replacing the contact layer.

(d) a localized or non-localized opposite conductivity type region which is a few (4 to 5) μm wide is formed in the strip included in each terrace by inserting impurities through the contact layer, said impurities corresponding to the same conductivity type as said layer, said region extending to the vicinity of the active layer therebeneath in order to constitute a P-N junction therewith;

(e) a metal deposit is made to individually make contact with each opposite conductivity type region;

(f) a common contact metal deposit is made on the base of the substrate;

(g) the opposite conductivity type regions are electrically insulated from one another at the transitions which separate them in order to form semiconductor structure stripes; and (h) the opposite ends of these stripes are optically prepared transversely to the long dimension of the terraces.

At present, the materials suitable for constituting such a double heterostructure are III-V alloys, and more precisely alloys comprising firstly at least one material from the group: aluminum, gallium, and indium; and secondly at least one material from the group: phosphorous, arsenic, and antimony.

In a particular embodiment, the active N-type layers have the composition $Ga_{1-x}Al_xAs$, with a different x each time, x being less than about 10%, whereas the confinement layers have the composition $Ga_{1-y}Al_yAs$, where y is substantially the same for all of them, and is equal to about 30%.

The layers of the double heterostructure are advantageously deposited by epitaxy, in particular by liquid phase epitaxy, or by molecular beam epitaxy, or by vapor phase deposition of metallo-organic compounds.

In practice, the thickness of the active layer is about one tenth of a micrometer, and the thickness of the confinement layers is about 1 micrometer.

Advantageously, in the particular embodiment mentioned above, the contact layer may also be constituted by a III-V alloy, such as P-type gallium arsenide, for example. The contact layer may also be made by epitaxy, and may have a thickness of 0.2 micrometers.

The above-specified region is formed using impurities taken from the group constituted by zinc, cadmium, magnesium, beryllium, and possibly silicon. It may be formed by diffusion, in particular when using zinc or cadmium, or by ion implantation followed by annealing, which technique is applicable to all of the above-specified materials.

Further, said region may be made over the major portion of the surface of the terrace, or else it may be localized at a small portion of said surface, only.

Operation (g) for isolating opposite conductivity type regions may be performed by localized etching using a dry method or a wet method, to form grooves going down to the substrate.

In a variant, operation (g) may be performed by proton implantation.

Finally, the optical preparation operation (h) may be performed either by cleaving, or else by shaping using a wet method or a dry method.

The substrate may be a III-V alloy which is highly in doped, or else it may be silicon.

Insofar as the above-defined method is performed on a large-sized semiconductor wafer comprising a plurality of elementary circuits, the method will naturally include the following additional step:

(i) split up the semiconductor structure into individual chips each comprising at least two adjacent stripes.

Naturally, the invention also extends to semiconductor devices obtained by the above-explained method. The general structure of such deice comprises:

a substrate;

at least two double heterostructure stacks in the form of elongate stripes on the substrate, disposed side-by-side and electrically insulated from one another, said two stacks having different numbers of active layers, the layers being of differing compositions, and the opposite small ends of the stripes being optically prepared;

two regions respectively present in the two top confinement layers, and each extending down to the vicinity of the active layer immediately therebeneath, to form a P-N junction therewith;

two contact layers respectively disposed on the two top confinement layers;

two contact deposits on said two contact layers; and a contact deposit on the substrate.

Such a device can be used, in particular, as a multi-wavelength semiconductor laser.

Other characteristics and advantages of the invention appear from reading the following detailed description together with the accompanying drawings, in which.

Figure 1:
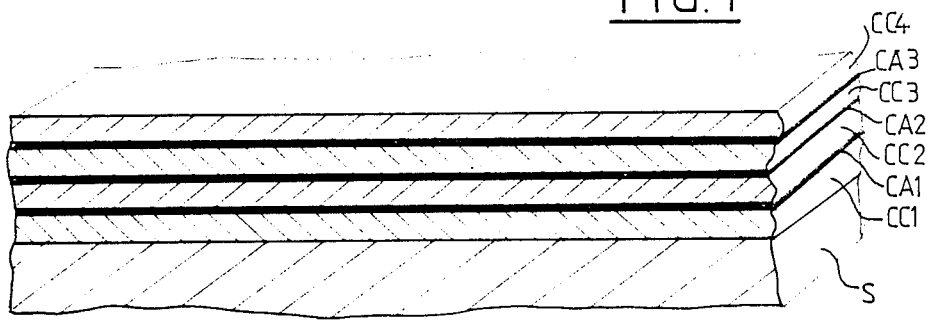
FIG. 1 is a diagram of the initial epitaxial double heterostructure.

In FIG. 1, the starting material is a substrate S which may, in general, be constituted by silicon or by an N-type semiconductor.

The remainder of the present description is limited to the so-called "GaAs system" case in which the base semiconductor is therefore gallium arsenide.

In this context, the substrate S is N+ type gallium arsenide, i.e. it has high N-type conducitivity.

The double heterostructure is made on the substrate by epitaxy and comprises a stack of various layers. Several different epitaxy techniques are known. Liquid phase epitaxy (LPE) is preferably used. In a variant, metallo-organic chemical vapor deposition (MOCVD) may be used, or else molecular beam epitaxy (MBE) may be used.

In a particular embodiment, the confinement layers are all of N-type material having the general formula: $Ga_{1-y}Al_yAs$, i.e. an alloy of gallium aluminum arsenide in which the aluminum fraction is y and the gallium fraction is $(1-y)$. Typically, y is about 30%, and the thickness of the confinement layers CC is about 1.5 micrometers.

After the first confinement layer CC1 has been grown by epitaxy on the substrate S, the first active layer CA1 is grown by epitaxy and it has the following composition, for example: $Ga_{1-x1}Al_{x1}As$, i.e. it is a gallium aluminum alloy in which the fraction of aluminium atoms is x1 and the fraction of gallium atoms is $(1-x1)$. The layer is typically 0.2 micrometers thick. The fraction x1 lies between 0 and 10%, depending on the desired wavelength, as described below.

A second confinement layer CC2 is then grown by epitaxy on the first active layer CA1.

The second active layer CA2 is then grown by epitaxy, and it also has a thickness of about 0.2 micrometers, but the fractions x2 of aluminum and gallium are different.

A third confinement layer CC3 is them formed, followed by a third active layer CA3 having a fraction x3, and finally a last confinement layer CC4, which terminates the double heterostructure stack.

Naturally, the number of confinement layers and active layers may be greater or smaller, depending on the number of different frequencies which are to be excitable in the laser device. The invention assumes that there exist at least two different active layers.

Figure 2:
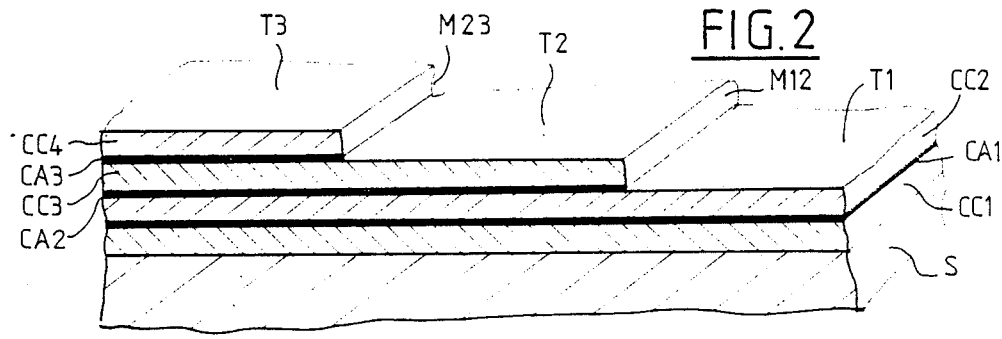
FIG. 2 shows the double heterostructure after being subjected to a first etching stage.

Starting with the double heterostructure of FIG. 1, the method of the invention continues with a photoetching stage during which the epitaxial layers are etched using a dry method or a wet method so as to form terraces T1, T2, and T3 as shown in FIG. 2. In practice, when a contact layer is to be formed by epitaxy, it is arranged that the top face of each terrace is about 1 micrometer from the active zone, i.e. about 0.5 micrometers are removed from the last confinement zone to be etched. Otherwise, when the active layers serve as their own contact layers, etching is stopped at the top each active layer.

This photoetching is selective, i.e. it takes place differently in parallel strips which are adjacent to one another and which are defined from the top face of the FIG. 1 stack.

In practice, the purpose of the etching is to define a kind of staircase, having as many steps as there are different active layers to be implemented in the final laser device.

This can be done by beginning by photoetching the strip lying over terrace T1, then photoetching the strips lying over both terraces T1 and T2 simultaneously, and them photoetching all three strips.

The staircase profile shown in FIG. 2 is thus obtained.

Each of the sub-steps within the overall photoetching operation may be performed using identical etching agents or using different agents.

Figure 3:
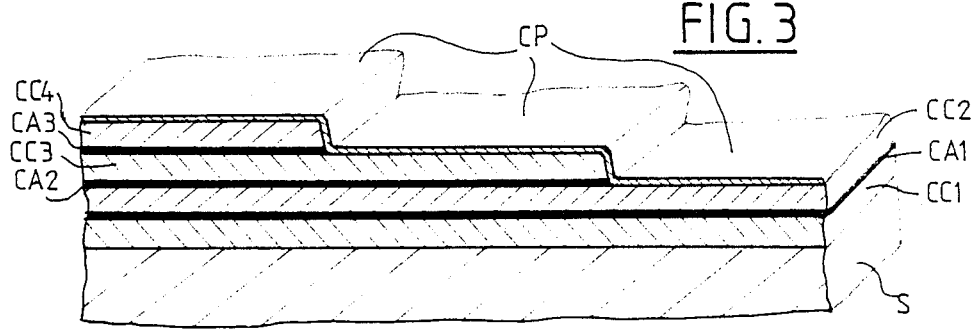
FIG. 3 shows the FIG. 2 double heterostructure after being covered with a contact layer.

FIG. 2 also shows transitions M12 between terraces T1 and T2 and M23 between terraces T2 and T3. At least when these transitions are removed in the final step, as described below, there is no need to take particular care about their uniformity The next step of the method (FIG. 3) consists in depositing a contact layer CP over all of the terraces and the transitions, said layer being constituted by a monocrystaline semiconductor having the opposite conductivity type to that of the double heterosturcture. It is simplest to make this contact layer of P-type gallium arsenide, by means of epitaxy, and for it to have a thickness of about 0.2 micrometers.

Figure 4:
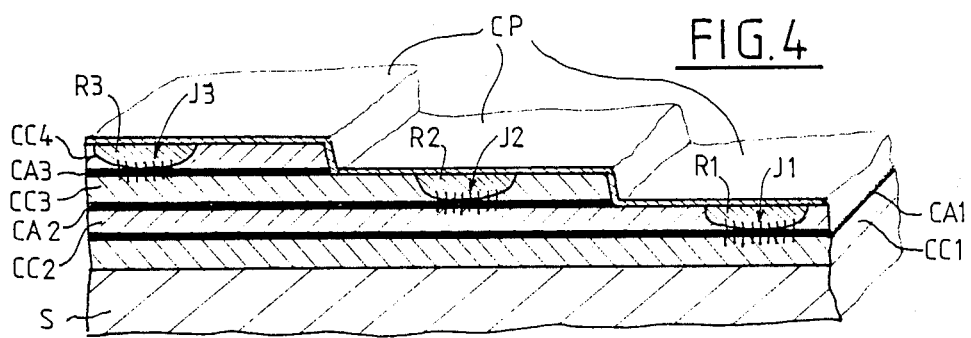
FIG. 4 shows the FIG. 3 double heterostructure in which junction regions have been made.

The making of the P-N laser junction which is essential for the device of the invention to operate as a laser is now described with reference to FIG. 4.

Localized P-type ion implantation is performed in the middle of each step or terrace, and the implantation can take place through the contact layer CP. Impurities "pre-deposited" in this way will migrate during an annealing operation into the highest confinement layer CC4 at terrace T3, into confinement layer CC3 at terrace T2, and into confinement layer CC2 at terrace T1. Regions R3, R2, and R1 are thus formed which extend each time through the adjacent top confinement layer (CC4, CC3, CC2 respectively) down to the vicinity of the active layer immediately therebeneath (CA3, CA2, CA1, respectively). Each of the regions R3, R2, R1 forms a P-N junction with the respective active layers CA3, CA2, CA1. These junctions J3, J2, and J1 are illustrated in FIG. 4 even though, in practice, they are not visible, optically.

A variant of the method consists in forming the regions R3, R2, and R1 by localized P-type diffusion.

The work "localized" simply means that the region is diffused within the area of each terrace T3, T2, and T1. This region may cover the major portion or indeed nearly all of the area of the terrace, or on the contrary, it may be small and occupy only a central portion thereof, as shown in FIG. 4.

As already mentioned, the material used has so far always been in the gallium arsenide system. The alloys constituting the active layers and the confinement layers may be obtained by weakly P-type doping a material which was initially of the N+ type, for example by adding impurities taken from the group: zinc, cadmium, magnesium, beryllium, and silicon.

Zinc and cadmium can be diffused or ion implanted. In principle, beryllium, magnesium, and silicon can only be ion implanted if a well-delimited region is to be made.

Figure 5:
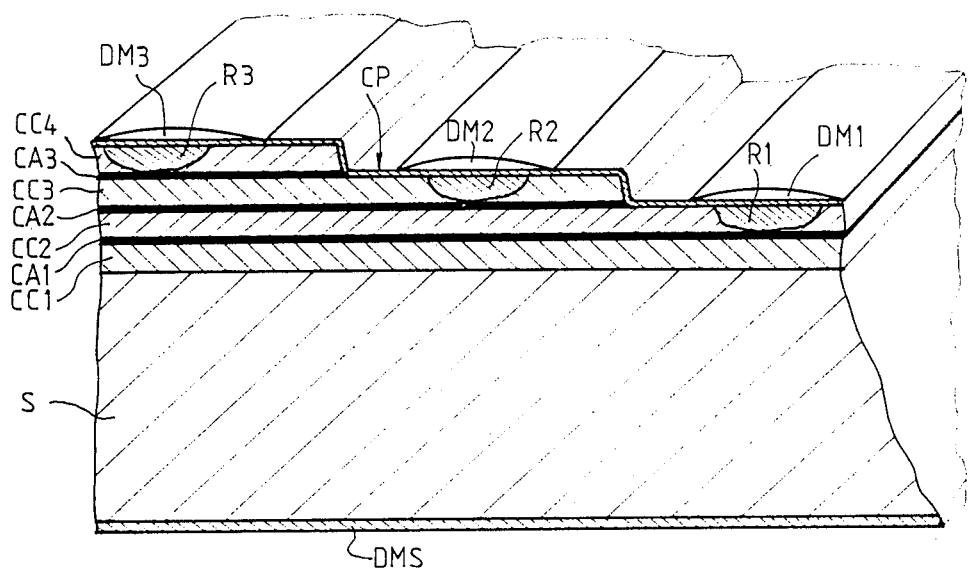
FIG. 5 shows the FIG. 4 double heterostructure after being coated with metal contact deposits.

Reference is now made to FIG. 5. This figure shows that metal contact layers are deposited. On the base of the substrate S, the contact layer may be a deposit of a goldgermanium (Au, Ge) alloy.

Individual contact deposits are performed at DM1, DM2, and DM3 overlying each of the regions R1, R2, and R3. These deposits are made, for example, from a gold-zinc alloy (Zn, Au).

It then remains to delimit and isolate each of the strips which is capable of operating as a laser diode.

Figure 6:
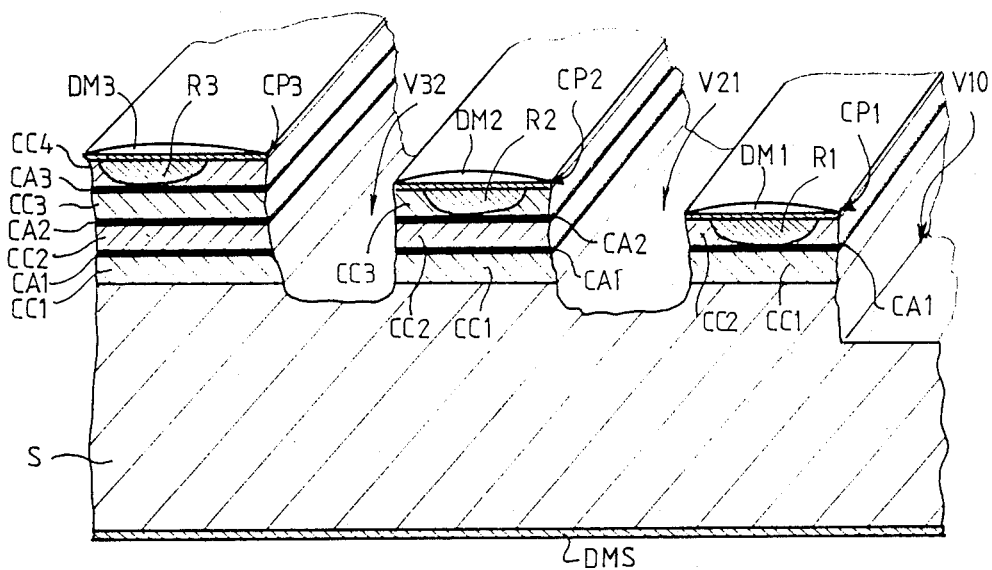
FIG. 6 shows the final form of a semiconductor device in accordance with the invention.

As shown in FIG. 6, this may be done by digging valleys V10, V21, and V32 respectively located to the right of terrace T1 and region R1, between terraces T1 and T2, thus removing transition M12, and between terraces T2 and T3, thus removing transition M23.

These valleys may be obtained in various different ways, and in particular using wet methods, i.e. simply by chemical etching. Otherwise they may be formed by dry methods, namely:
 reactive ion etching (RIE);
 reactive ion beam etching (RIBE);
 magnesium ion etching (MIE); or
 conventional ion shaping (UI, for "usinage ionique").

The device obtained in this way is suitable for producing a laser effect at a different wavelength in each of the regions R1, R2, and R3, insofar as adjacent active layers have different compositions in all three cases. Three different wavelengths can thus be selectively emitted using the three devices shown in FIG. 6, and each of them can be independently controlled.

In order to manifest the laser effect, it is necessary to optically prepare the opposite ends of the FIG. 6 stripes, i.e. the ends which are shown in section, and the ends opposite thereto.

This preparation can be performed conventionally by cleaving, or else by shaping using a web method or a dry method.

In another variant of the invention, the electrical insulation between the various laser diodes may be obtained by proton implantation instead of making valleys such as V10, V21, and V32.

Naturally, the invention is not limited to the embodiment described. In particular, multi-wavelength structures can be made not only in the so-called gallium arsenide GaAs system, but also in the so-called InP (indium phosphide) system, by using appropriate ternary alloys, or indeed with any other semiconductor material having light-radiating properties.

Insofar as it is desirable to prepare a plurality of multi-wavelength laser devices on a common semiconductor wafer, the manufacturing method naturally includes an additional step of splitting up the semiconductor structure into individual chips each containing at least two adjacent stripes.

As can be seen in FIG. 6, the final device comprises:
a substrate S;
at least two double heterostructure stacks in the form of elongate stripes on the substrate disposed side-by-side and electrically insulated from one another, said two stacks having different numbers of active layers (CA1, CA2, CA3), and having top active layers (CA1, CA2, CA3) furthest from the substrate S which are of different compositions. The opposite small ends of these stripes are optically prepared;
at least two regions (R1, R2, R3) respectively present in the two top confinement layers, each extending to the vicinity of the active layer (CA1, CA2, CA3) immediately thereunderneath in order to form a P-N junction therewith;
at least two contact layers (CP1, CP2, CP3) respectively disposed on the two top confinement layers;
at least two contact deposits (DM1, DM2, DM3) on said two contact layers; and
a common contact deposit (DMS) on the base of the substrate.

Such a device is particularly advantageous for increasing the telecommunications transmission capacity of optical fibers, or else in optical disk readers.

We claim:

1. A method of manufacturing a semiconductor structure, in particular a structure suitable for producing a laser effect, the method being characterized in that it comprises the following steps:
   (a) a monocrystaline double heterostructure stack is deposited on a substrate (S), said stack begin constituted by active layers (CA) having different compositions and having light radiating properties, each of said layers being sandwiched between two confinement layers (CC) having a microcrystal lattice size adjacent to that of the active layers, with all of said layers having the same conductivity type;
   (b) the top of the stack is selectively etched in parallel strips which are adjacent to one another in order to lay bare confinement layers (CC) at different depths, at least on two adjacent strips, with the confinement layers (CC) thus laid bare defining parallel terraces (T1, T2, T3) separated from one another by transitions (M12, M23);
   (c) a contact layer (CP) is formed on said terraces;
   (d) an opposite conductivity type region (R1, R2, R3) is formed in the strip included in each terrace by inserting impurities through the contact layer, said impurities corresponding to the same conductivity type as the contact layer and said region extending through the top confinement layer (CC2, CC3, CC4) to the vicinity of the active layer thereunderneath (CA1, CA2, CA3) in order to constitute a P-N junction therewith (J1, J2, J3);
   (e) individual metal contacts (DM1, Dm2, Dm3) are deposited on each opposite conductivity type region;
   (f) a common metal contact (DMS) is deposited on the substrate;
   (g) the opposite conductivity type regions are electrically isolated from one another (V10, V21, V32) at the transitions therebetween, in order to form semiconductor structure stripes; and
   (h) the opposite ends of said stripes are optically prepared transversely to the long dimension of the terraces.

2. A method according to claim 1, characterized in that the materials constituting the double heterostructure are III-V alloys.

3. A method according to claim 2, characterized in that the materials constituting the double heterostructure are alloys of at least one material from the group: aluminum, gallium, and indium; and at least one material from the group: phosphorous, arsenic, and antimony.

4. A method according to claim 3, characterized in that the N-type active layers have the composition $Ga_{1-x}Al_xAs$, where x is different each time and is less than about 10%, whereas the confinement layers have the composition $Ga_{1-y}Al_yAs$, where y is substantially the same for all of them and equal to about 30%.

5. A method according to claim 1, 2, 3, or 4, characterized in that the double heterostructure layers are deposited by epitaxy, in particular by liquid phase epitaxy, or by molecular beam epitaxy, or by metalo organic chemical vapor deposition.

6. A method according to claim 1, 2, 3, or 4, characterized in that the thickness of the active layers is about one tenth of a micrometer, whereas the thickness of the confinement layers is about 1 micrometer.

7. A method according to claim 1, 2, 3, or 4, characterized in that etching operation (b) is performed by photoetching, and serves to remove a portion of the thickness of the confinement layer at which it stops, and in that operation (c) consists in depositing a contact layer by epitaxy.

8. A method according to claim 7, characterized in that the residual thickness of said confinement layer is about 1 $\mu$m.

9. A method according to claim 1, 2, 3, or 4, characterized in that the contact layer is also a III-V alloy.

10. A method according to claim 9, taken in combination with claim 4, characterized in that the contact layer is P-type gallium arsenide.

11. A method according to claim 1, 2, 3, or 4, characterized in that the etching step the top of each of the active layers, with the active layers then serving as contact layers.

12. A method according to claim 1, 2, 3, or 4, characterized in that said region is formed by means of impurities selected from the group comprising: zinc, cadmium, magnesium, and beryllium.

13. A method according to claim 1, 2, 3, or 4, characterized in that said region is formed by ion implantation followed by annealing.

14. A method according to claim 1, 2, 3, or 4, characterized in that said region is formed by diffusion.

15. A method according to claim 1, 2, 3, or 4 characterized in that said region is localized, and affects only a small portion of the area of the terrace.

16. A method according to claim 1, 2, 3, or 4, characterized in that operation (g) of isolating the terraces is performed by localized etching grooves down to the substrate by means of a dry method or a wet method.

17. A method according to any claim 1, 2, 3, or 4, characterized in that the operation (g) of isolating the terraces is performed by proton implantation.

18. A method according to claim 1, 2, 3, or 4, characterized in that the operation (h) of optical preparation includes cleaving.

19. A method according to claim 1, 2, 3, or 4, characterized in that the operation h) of optical preparation includes shaping by a wet method or a dry method.

20. A method according to claim 1, 2, 3, or 4, characterized in that the substrate is silicon or a highly N-doped III-V alloy.

21. A method according to claim 1, 2, 3, or 4, characterized in that it includes the following additional operation: (i) separating the semiconductor structure into individual chips each comprising at least two adjacent stripes.

* * * * *